(12) United States Patent
Kozlovsky et al.

(10) Patent No.: US 9,256,700 B1
(45) Date of Patent: Feb. 9, 2016

(54) PUBLIC SERVICE FOR EMULATION OF APPLICATION LOAD BASED ON SYNTHETIC DATA GENERATION DERIVED FROM PREEXISTING MODELS

(71) Applicant: EMC Corporation, Hopkinton, MA (US)

(72) Inventors: Vitaly S. Kozlovsky, St. Petersburg (RU); Dmitry N. Tylik, St. Petersburg (RU); Thirumale N. Niranjan, Bangalore (IN)

(73) Assignee: EMC Corporation, Hopkinton, MA (US)

( * ) Notice: Subject to any disclaimer, the term of this patent is extended or adjusted under 35 U.S.C. 154(b) by 403 days.

(21) Appl. No.: 13/731,274

(22) Filed: Dec. 31, 2012

(51) Int. Cl.
*G06F 17/50* (2006.01)
(52) U.S. Cl.
CPC .................................. *G06F 17/5009* (2013.01)
(58) Field of Classification Search
None
See application file for complete search history.

(56) References Cited

U.S. PATENT DOCUMENTS

| | | | |
|---|---|---|---|
| 7,090,749 B2 | 8/2006 | Flores et al. | |
| 8,417,715 B1 * | 4/2013 | Bruckhaus et al. | 707/758 |
| 2008/0262824 A1 * | 10/2008 | Oslake et al. | 703/22 |
| 2010/0324869 A1 * | 12/2010 | Cherkasova et al. | 703/2 |
| 2011/0161952 A1 * | 6/2011 | Poddar et al. | 717/173 |
| 2012/0053925 A1 * | 3/2012 | Geffin et al. | 703/21 |
| 2012/0143588 A1 | 6/2012 | Liu et al. | |
| 2014/0006358 A1 | 1/2014 | Wang et al. | |

OTHER PUBLICATIONS

Iosup, Alexandru, et al. "The grid workloads archive." Future Generation Computer Systems 24.7 (2008): 672-686.*
ter Haar, Phil, and Brad Cain. IPME and External Clients: Enhancing Performance by Offloading Simulation Workload to External Clients; Explaining and Simplifying the Process. No. DRDC-T-TM-2007-033. Defence Research and Development Toronto (Canada), 2007.*

* cited by examiner

*Primary Examiner* — Omar Fernandez Rivas
*Assistant Examiner* — Bijan Mapar
(74) *Attorney, Agent, or Firm* — BainwoodHuang (57) ABSTRACT

An improved technique involves providing application workload simulation capability via a centrally located synthetic data generation service to an external party. Along these lines, a client inputs a description of an application scenario into a web form which sends a request to a central server to generate a synthetic data simulation program. The central server extracts parameters values from the request corresponding to the application scenario and finds a model in a model database based on the parameter values. From the model, the central server derives a Java program that generates synthetic data for simulating the operation load of the application scenario described by the client, and sends the Java program to the client. The client is then able to generate synthetic data using the Java program on various configurations to determine which will successfully handle the synthetic data load continuously over a given period of time.

19 Claims, 4 Drawing Sheets

PUBLIC SERVICE FOR EMULATION OF APPLICATION LOAD BASED ON SYNTHETIC DATA GENERATION DERIVED FROM PREEXISTING MODELS

BACKGROUND

Some data storage systems include complex arrangements of storage disk arrays, configuration management interfaces, and storage processors. A system administrator faces many choices in making adjustments to the configuration of a data storage system in response to changing conditions, many of them resulting in suboptimal performance. Along these lines, the system administrator may seek advice with regard to provisioning additional storage when the performance of a storage processor falls below expectation when the storage processor is managing a sufficiently heavy disk I/O operation load within a file system while running certain applications.

In some circumstances, the system administrator is unable to share data from applications with those whom the administrator would seek for configuration advice, the advisor. Conventional approaches to optimizing configurations for data storage systems in such circumstances involve using synthetic data generation to simulate application workload properties when application data is not available. For example, the advisor may use her knowledge of her customers to determine a schedule for applying a load on a file system for storage hardware of a particular configuration. When the hardware is able to continuously handle this load for at least some amount of time, then the configuration is acceptable for the particular customer running the application for which the synthetic I/O operation load data was generated.

SUMMARY

Unfortunately, there are deficiencies with the above-described conventional approaches to optimizing configurations for data storage systems. For example, customers receive configuration advice based on incomplete information. That is, the synthetic data generation used to determine optimal customer configurations is based on models that may not reflect actual customer working environments.

In contrast to the conventional approaches to optimizing configurations for data storage systems in which it is difficult to make accurate predictions about customers' configurations, an improved technique involves providing application workload simulation capability via a centrally located synthetic data generation service to an external party. Along these lines, a client inputs a description of an application scenario into a web form which sends a request to a central server to generate a synthetic data simulation program. The central server extracts parameters values from the request corresponding to the application scenario and finds a model in a model database based on the parameter values. From the model, the central server derives a Java program that generates synthetic data for simulating the operation load of the application scenario described by the client, and sends the Java program to the client. The client is then able to generate synthetic data using the Java program on various configurations to determine which will successfully handle the synthetic data load continuously over a given period of time.

Advantageously, the improved technique provides an accurate indication of plausible configurations that will run a customer's applications without exposing or otherwise endangering proprietary customer application data. By granting the customer access to models that simulate a range of application scenarios, the customer is able to test various configurations for running a particular scenario without exposing proprietary information to a third party. The scenario will be more accurate than one devised by such a third party who might generate synthetic data on the customer's behalf without the ability to know what scenario to run.

One embodiment of the improved technique is directed to a method of simulating application workloads on storage system devices. The method includes receiving, from an external client at a remote location, a request to simulate an application workload on a storage system device resulting from an execution of an application, the request including values of a set of application workload parameters. The method also includes obtaining, with reference to a Model Database, an application model based on the values of the set of application workload parameters, the application model being configured to reproduce application workload conditions on the storage system device. The method further includes transmitting, to the external client, an application simulation program which, when executed, causes a client device to generate synthetic data that is indicative of how the storage system device performs under the application workload conditions, the application simulation program having been compiled based on the application model.

Additionally, some embodiments of the improved technique are directed to a system constructed and arranged to simulate application workloads on storage system devices. The system includes a network interface, memory, and a controller including controlling circuitry constructed and arranged to carry out the method of simulating application workloads on storage system devices.

Furthermore, some embodiments of the improved technique are directed to a computer program product having a non-transitory computer readable storage medium which stores code including a set of instructions to carry out the method of simulating application workloads on storage system devices.

BRIEF DESCRIPTION OF THE DRAWING

The foregoing and other objects, features and advantages will be apparent from the following description of particular embodiments of the invention, as illustrated in the accompanying figures in which like reference characters refer to the same parts throughout the different views.

DETAILED DESCRIPTION

An improved technique involves providing application workload simulation capability via a centrally located synthetic data generation service to an external party. Along these lines, a client inputs a description of an application scenario into a web form which sends a request to a central server to generate a synthetic data simulation program. The central server extracts parameters values from the request corresponding to the application scenario and finds a model in a model database based on the parameter values. From the model, the central server derives a Java program that generates synthetic data for simulating the operation load of the application scenario described by the client, and sends the Java program to the client. The client is then able to generate synthetic data using the Java program on various configurations to determine which will successfully handle the synthetic data load continuously over a given period of time.

Advantageously, the improved technique provides an accurate indication of plausible configurations that will run a customer's applications without exposing or otherwise endangering proprietary customer application data. By granting the customer access to models that simulate a range of application scenarios, the customer is able to test various configurations for running a particular scenario without exposing proprietary information to a third party. The scenario will be more accurate than one devised by such a third party who might generate synthetic data on the customer's behalf without the ability to know what scenario to run.

Figure 1:
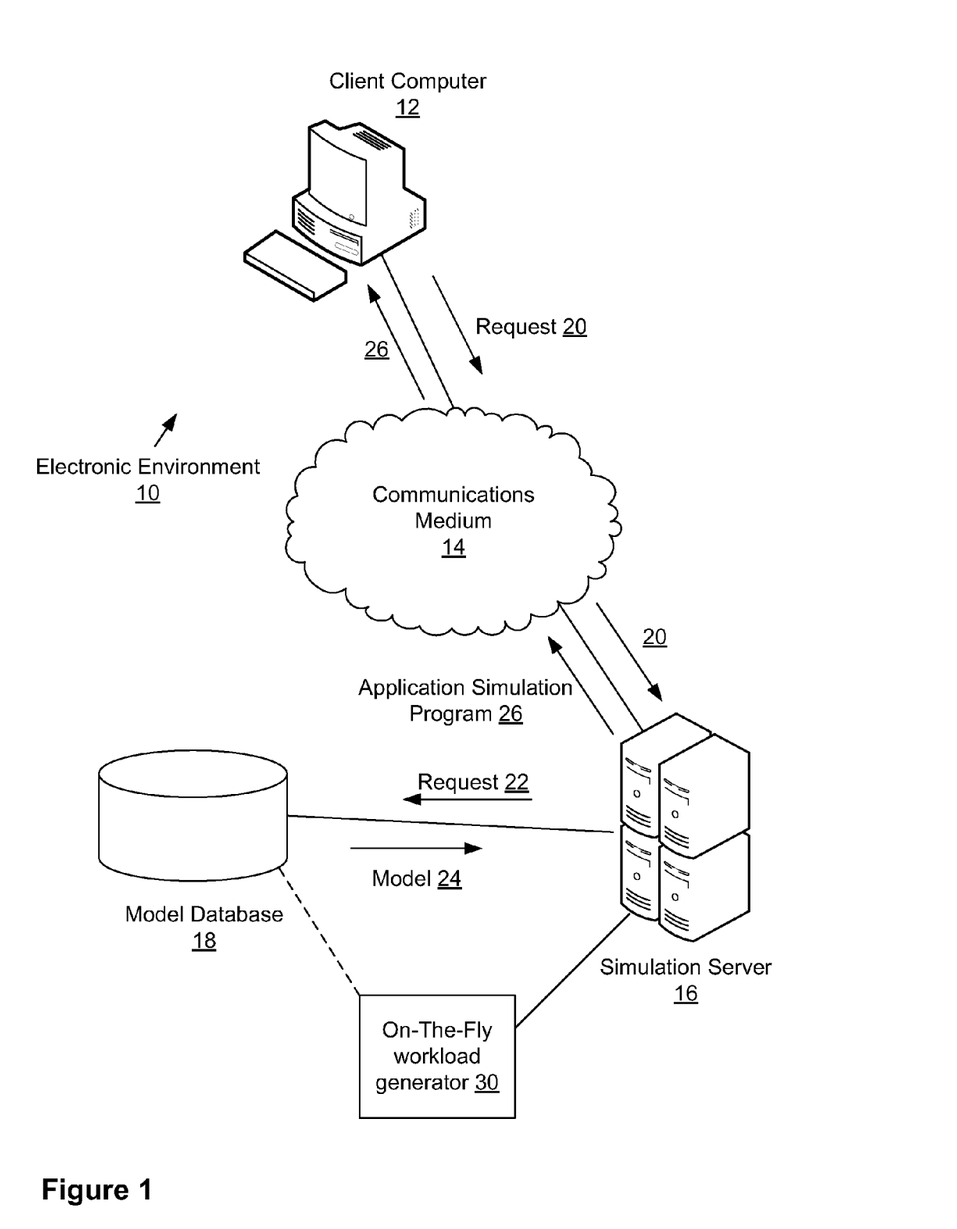
FIG. 1 is a block diagram illustrating an example electronic environment for carrying out the improved technique.

FIG. 1 illustrates an example electronic environment 10 for carrying out the improved technique. Electronic environment 10 includes client computer 12, communications medium 14, simulation server 16, and model database 18.

Client computer 12 is configured to generate an application scenario to be submitted to simulation server 16. Client computer 12 is also configured to receive a Application Simulation Program from simulation server 16. In some arrangements, client computer 12 is further configured to run a web browser having a browser window from which a user (not pictured) may input application workload parameter values. Client computer 12 is further configured to issue an execution command for the Application Simulation Program to execute on another computer device. Client computer 12 takes the form of a desktop computer; in some arrangements, however, client computer 12 may be a server, a laptop computer, a tablet computer, a smartphone, or any other kind of computing device.

Communication medium 14 provides network connections between client computer 12, and simulation server 16. Communications medium 14 may implement a variety of protocols such as TCP/IP, UDP, ATM, Ethernet, Fibre Channel, combinations thereof, and the like. Furthermore, communications media 14 may include various components (e.g., cables, switches/routers, gateways/bridges, NAS/SAN appliances/nodes, interfaces, etc.). Moreover, the communications medium 14 is capable of having a variety of topologies (e.g., queue manager-and-spoke, ring, backbone, multi drop, point to-point, irregular, combinations thereof, and so on).

Simulation server 16 is configured to perform a lookup operation on model database 18 upon receiving a simulation request from client computer 12. Simulation server 16 is also configured to perform a lookup operation on model database 18 to obtain a model for generating a Java program for generating synthetic data. Simulation server 16 is further configured to generate, or cause another computer (not pictured) to generate, the Java program that generates synthetic data for simulating the operation load of the application scenario described in the simulation request. Simulation server 16 is a server computer; in some arrangements, however, simulation server 16 may take the form of a desktop computer.

Model database 18 is configured to store various models that describe application scenarios and form the basis of Synthetic Data Generator (SDG) program configured to create an Application Simulation Program 26 which generates synthetic data according to the models. In some arrangements, Application Simulation Program 26 might also be stored in the model database 18 for quick access. Model database 18 may take the form of a relational database using SQL, although in some arrangements, model database 18 is a non-SQL database.

In some arrangements, client computer 12 runs a browser program that displays a user interface in a browser window from which a user on client computer 12 may describe the application scenario. Further details of the user interface will be described below with respect to FIG. 3.

During operation, client computer 12 sends a request 20 to simulation server 16 over communications medium 14. Request 20 includes values of a set of application workload parameters; such values include particular applications, or combinations of applications, that a client using and client computer 12 may wish to run, a number of users that may run the application in a given time period, an amount of storage required by particular users. In case of lack of knowledge of the particular application specifics the client might provide a general field description (in predefined terms) or choose from vertical industry instances (e.g., financial, petroleum, pharmaceutical).

After receiving request 20, simulation server 16 formulates another request 22 to access a model in model database 18. Request 22 may be viewed as a request to perform a lookup operation on model database 18 for a model that has the values of the set of application workload parameters from request 20.

Through request 22, simulation server 16 performs the lookup operation on model database 18 to find a model 24 that best meets the application scenario described by the values of the set of application workload parameters from request 20. In some arrangements, model database 18 arranges models by vertical industry and application used. Along these lines, consider a scenario in which the client works in the financial industry and uses Oracle on-line transaction processing (OLTP) database for keeping track of records in an accounting firm. In this case, simulation server 16 specifies this particular vertical industry and the lookup operation takes place in the location in model database 18 where such records are stored. It should be understood that models for different vertical industries that refer to identical applications may produce Application Simulation Programs that generate different synthetic datasets because such datasets are configured to simulate patterns of usage which vary between different vertical industries.

It should also be understood that, in some arrangements, model database 18 might not have a model containing the exact values of the set of application workload parameters from request 20. This is due to the fact that a client may combine any number of possible applications, each having any number of users requiring resources. In such a case, request 22 specifies that a lookup operation select one or more of the models whose parameter values most closely match the values of the set of application workload parameters from request 20. Simulation server 16 then performs using an On-The-Fly workload generator 30 a best fit operation on such models and generates new model 24 to most closely match the values of the set of workload parameters received in request 20. It should be understood that On-The-Fly workload generator 30 may also be a part of model database 18, in which simulation server 16 sends a command that On-The-Fly workload generator 30 be run.

From model 24, simulation server 16 generates an Application Simulation program 26 configured to generate synthetic data for the client. In some arrangements, Application Simulation program 26 is a Java program configured to run on most platforms, including Microsoft® Windows, Unix®, Linux, and others. In this case, model 24 contains code segments which, when inserted into a code base on simulation server 16, complete Java code, and cause simulation server 16 to be able to compile the Java code and build Application Simulation program 26. In some arrangements, simulation server 16 arranges for a dedicated server (not pictured) to compile the Java code and build Application Simulation Program 26. In other arrangements, simulation server builds a Java p-code machine.

Simulation server 16 then sends Application Simulation Program 26 to client computer 12 for the client to run and generate synthetic data and evaluate the configurations that can run on a particular storage system device, such as a storage appliance. In some arrangements, client computer 12 may send information concerning results of running the Application Simulation Program on various storage system devices to simulation server 16. In such a case, simulation server 16 may then send these results to model database 18 so that model database 18 may update its models based on the results.

Further details of simulation server 16 are discussed below with respect to FIG. 2.

Figure 2:
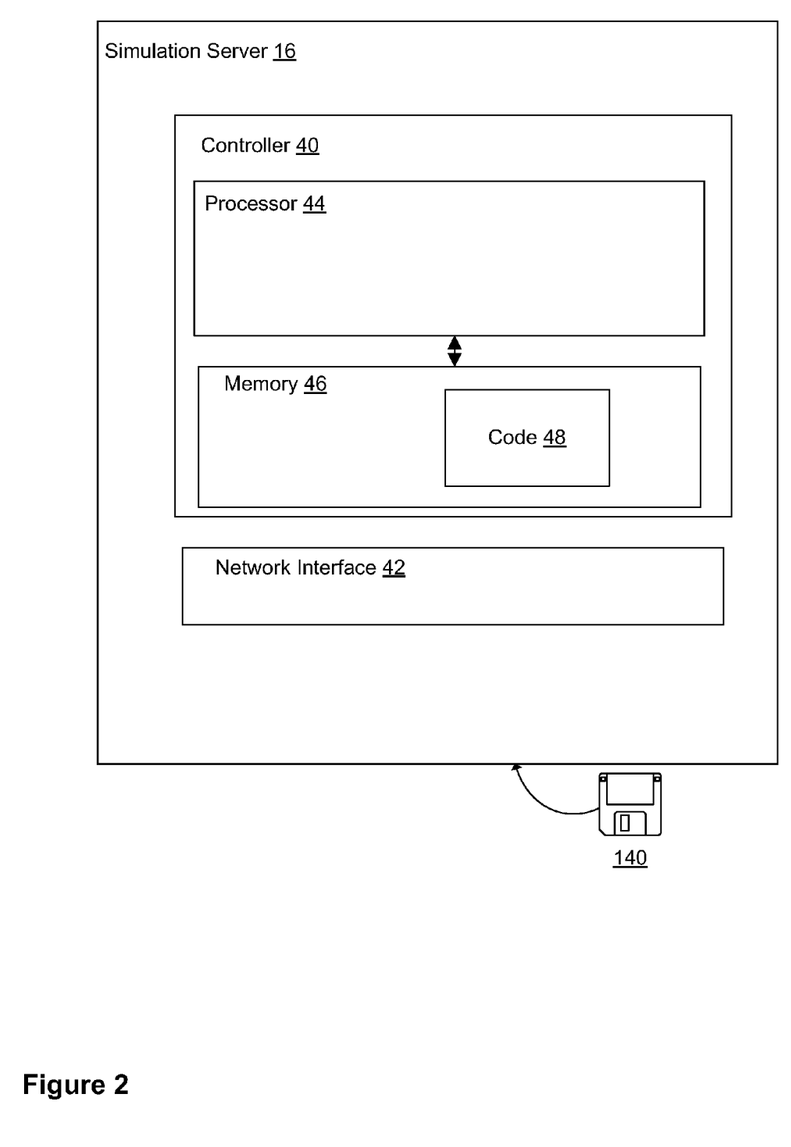
FIG. 2 is a block diagram illustrating an example simulation server within the electronic environment shown in FIG. 1.

FIG. 2 illustrates details of an example simulation server 16. Simulation server 16 includes controller 40, which in turn includes processor 44 and memory 46, and network interface 42.

Network interface 42 takes the form of an Ethernet card; in some arrangements, network interface 42 takes other forms including a wireless receiver and a token ring card.

Memory 46 is configured to store code 48 that contains instructions configured to cause the processor to carry out the improved technique. Memory 46 generally takes the form of, e.g., random access memory, flash memory or a non-volatile memory.

Processor 44 takes the form of, but is not limited to, Intel or AMD-based MPUs, and can include a single or multi-cores each running single or multiple threads. In some arrangements, processor 44 is one of several processors working together.

In some arrangements, processor 44 is configured to send a browser script to client computer 12 (see FIG. 1) in order for client computer 12 to display a user interface within a browser window that allows a user to send request 20 (see FIG. 1) to simulation server 16. Further details of such a user interface are described below with respect to FIG. 3.

Figure 3:
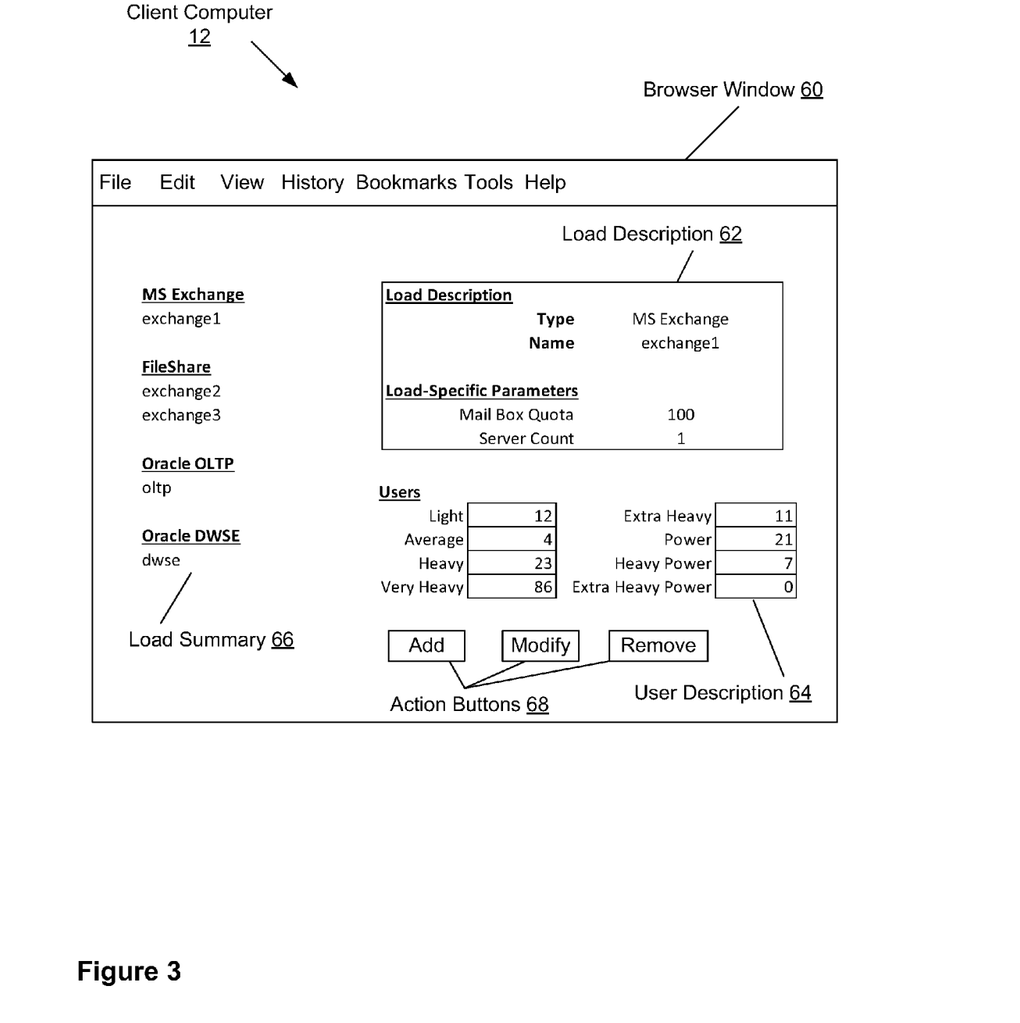
FIG. 3 is a block diagram illustrating an example graphical user interface (GUI) on a client computer within the electronic system shown in FIG. 1.

FIG. 3 illustrates an example browser window 60 from which a user on client computer 12 is able to send request 20 (see FIG. 1). Browser window 60 includes a load description pane 62, a user description pane 64, a load summary pane 66, and action buttons 68.

Load description pane 62 is configured to allow a client to input various details about a particular application that will generate a load on a storage system device when run. For example, the load description type, which is an application that will generate a load, is Microsoft® Exchange. In some arrangements, the load description type is a drop down menu of possible applications used in a particular vertical industry. For the particular application chosen, the client provides a load name, in this case, "exchange 1". For the load, the user inputs load-specific parameters which change for different applications. For example, load-specific parameters for Microsoft® Exchange take the form of a mailbox quota and a server count.

User description pane 64 is configured to allow the client to not only input the number of users of the storage system device, but also to provide weighting factors for each user depending on the expected load each user will generate. In the example provided in FIG. 3, load description pane provides eight categories of users.

Load summary pane 66 includes a list of all of the load names that were selected by the client in load description pane 62. It should be understood that load summary pane 66 may include more than one instance of an application, as shown in FIG. 3 in the FileShare application.

Action buttons 68 allow the user to add a new application and modify or remove an existing one.

In some arrangements, browser window 60 contains further features (not pictured) that allow a client to see when Application Simulation Program 26 (see FIG. 1) has been received by client computer 12. In such a case, browser window 60 may include functionality to allow the client to run SDG program 26 within the browser context and send resulting configurations to simulation server 16 (see FIG. 1) for model updating, or to allow simulation server 16 or the browser to generate the configuration parameters based on the results.

Figure 4:
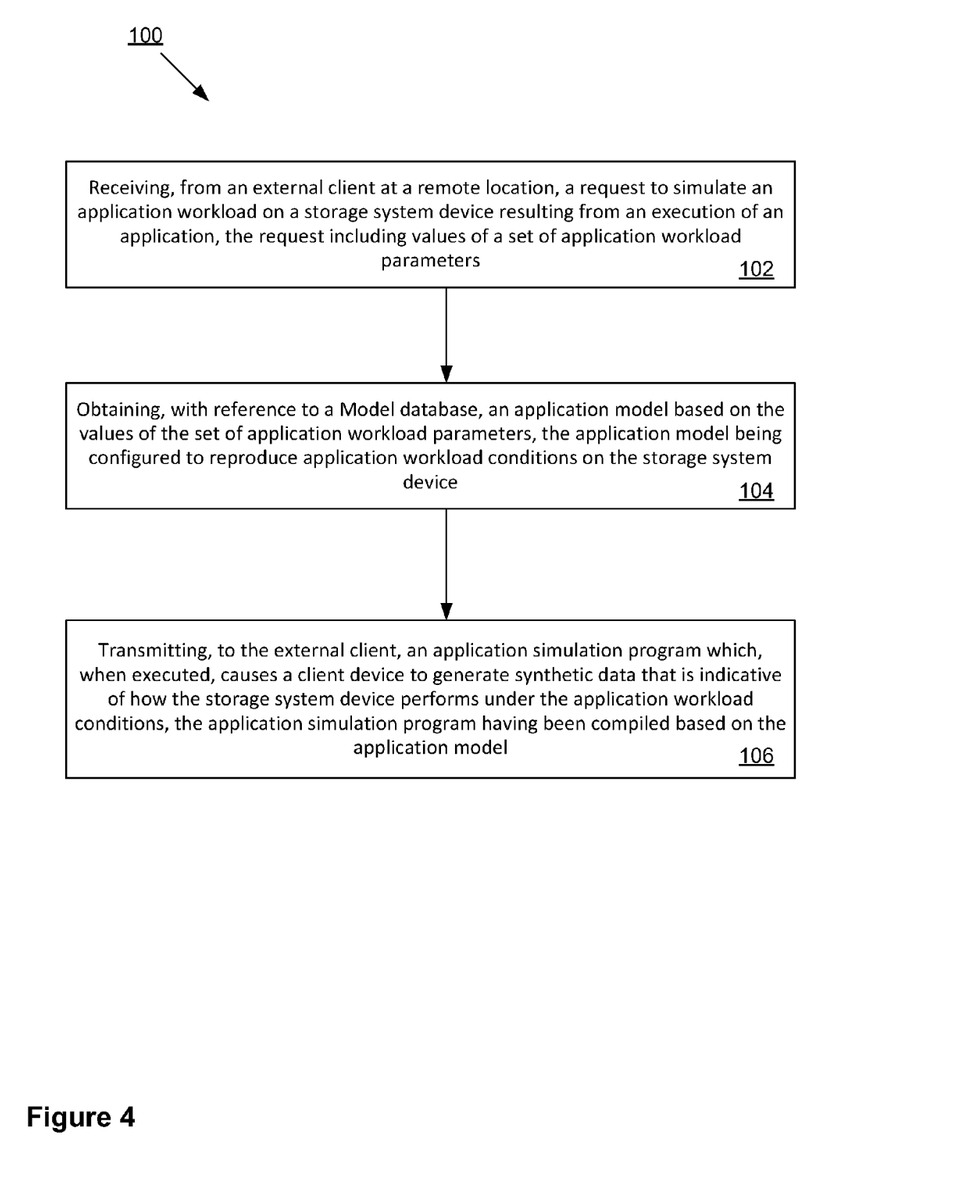
FIG. 4 is a flow chart illustrating an example method of carrying out the improved technique within the electronic environment shown in FIG. 1.

FIG. 4 illustrates a method 100 of simulating application workloads on storage system devices, including steps 102, 104, and 106. In step 102, a request, e.g., request 20, to simulate an application workload on a storage system device resulting from an execution of an application is received by, e.g., simulation server 16, from an external client, e.g., client computer 12, at a remote location, the request including values of a set of application workload parameters. In step 104, an application model, e.g., model 24, based on the values of the set of application workload parameters is obtained by, e.g., simulation server 16, with reference to a local database, e.g., model database 18, the application model being configured to reproduce application workload conditions on the storage system device. In step 106, an application simulation program, e.g., program 26, which, when executed, causes a client device to generate synthetic data that is indicative of how the storage system device performs under the application workload conditions is transmitted by, e.g., simulation server 16, to the external client, the application simulation program having been compiled based on the application model.

While various embodiments of the invention have been particularly shown and described, it will be understood by those skilled in the art that various changes in form and details may be made therein without departing from the spirit and scope of the invention as defined by the appended claims.

For example, while the examples above indicated that the generated Application Simulation Program was sent to client computer 12 for a client to run, in other arrangements the Application Simulation Program may be run by a third party, or simulation server 16 itself.

Furthermore, it should be understood that some embodiments are directed to simulation server 16, which is constructed and arranged to simulate application workloads on storage system devices. Some embodiments are directed to a process of simulating application workloads on storage system devices. Also, some embodiments are directed to a computer program product which enables computer logic to simulate application workloads on storage system devices.

In some arrangements, simulation server 16 is implemented by a set of processors or other types of control/processing circuitry running software. In such arrangements, the software instructions can be delivered, within simulation server 16, in the form of a computer program product 140 (see FIG. 2), each computer program product having a computer readable storage medium which stores the instructions in a non-volatile manner. Alternative examples of suitable computer readable storage media include tangible articles of manufacture and apparatus such as CD-ROM, flash memory, disk memory, tape memory, and the like.

What is claimed is:

1. A method performed by a computer of providing an external client capability of simulating application workloads on storage system devices, the method comprising:
receiving, from an external client at a remote location, a request to simulate an application workload on a storage system device resulting from an execution of an application, the request including values of a set of application workload parameters;
obtaining, with reference to a Model database, an application model based on the values of the set of application workload parameters, the application model being configured to reproduce application workload conditions on the storage system device;
compiling an application simulation program based on the application model; and
after compiling the application simulation program, transmitting, to the external client, the application simulation program which, when executed, causes a client device to generate synthetic data that is indicative of how the storage system device performs under the application workload conditions;
wherein obtaining the application model includes:
locating a first model stored in the Model database having first values of the set of application workload parameters that match the values of the set of application workload parameters of the request to within the predefined tolerance;
locating a second model stored in the Model database having second values of the set of application workload parameters match the values of the set of application workload parameters of the request to within the predefined tolerance; and
performing a best fit operation on the first values and the second values to produce the application model.

2. The method of claim 1, further comprising:
providing a browser script to the external client that is configured to i) provide a graphical user interface within a browser window on the client device from which the external party inputs the values of the set of application workload parameters, and ii) transmit the request from a browser window on a computer.

3. The method of claim 2,
wherein the browser script is further configured to execute the application simulation program on the client device;
wherein the method further comprises:
receiving, by the computer, the synthetic data generated by the client device; and
providing configuration information to the external client based on the synthetic data.

4. The method of claim 3,
wherein providing the configuration information to the external client includes:
verifying whether the application simulation program has run continuously on the client device for at least a predetermined amount of time.

5. The method of claim 3, further comprising:
performing an update operation on the application model based on the synthetic data generated by the client device.

6. The method of claim 1,
wherein obtaining the application model further includes:
performing a lookup operation on the local database, the lookup operation being configured to locate a model stored in the Model database having values of the set of application workload parameters that match the values of the set of application workload parameters of the request to within a predefined tolerance.

7. The method of claim 6,
wherein the first values of the set of application workload parameters includes a value corresponding to a first application used by the external client;
wherein the second values of the set of application workload parameters includes a value corresponding to a second application used by the external client;
wherein locating the first model includes:
producing a model from the Model database derived from data generated from a simulation of the first application; and
wherein locating the second model includes:
producing a model from the Model database derived from data generated from a simulation of the second application.

8. The method of claim 6,
wherein models stored in the Model database are classified according to values of particular application workload parameters of the set of application workload parameters;
wherein receiving the request to simulate the application workload includes:
extracting, as values of the particular application workload parameters, i) a vertical industry indicative of an industrial setting in which the external client operates, and ii) an application used by the external client; and
wherein performing the lookup operation further includes:
obtaining a set of entries of the database corresponding to the vertical industry and the application.

9. The method of claim 1, further comprising:
prior to transmitting the application simulation program:
producing code based on the application model, the code being configured to run on the external client; and
performing a compilation operation on the Java application to produce the application simulation program.

10. An electronic apparatus constructed and arranged to provide an external client capability of simulating application workloads on storage system devices, the apparatus comprising:
a network interface;
memory; and
a controller including controlling circuitry, the controlling circuitry being constructed and arranged to:
receive, from an external client at a remote location, a request to simulate an application workload on a storage system device resulting from an execution of an application, the request including values of a set of application workload parameters;
obtain, with reference to a local database, an application model based on the values of the set of application workload parameters, the application model being configured to reproduce application workload conditions on the storage system device;
compile an application simulation program, the compilation of the application simulation program being based on the application model; and
after the application simulation program has been compiled, transmit, to the external client, the application simulation program which, when executed, causes a client device to generate synthetic data that is indicative of how the storage system device performs under the application workload conditions;

wherein the controlling circuitry constructed and arranged to obtain the application model is further constructed and arranged to:
  locate a first model stored in the Model database having first values of the set of application workload parameters that match the values of the set of application workload parameters of the request to within the predefined tolerance;
  locate a second model stored in the Model database having second values of the set of application workload parameters that match the values of the set of application workload parameters of the request to within the predefined tolerance; and
  perform a best fit operation on the first values and the second values to produce the application model.

11. The apparatus of claim 10,
wherein the controlling circuitry is further constructed and arranged to:
  provide a browser script to the external client that is configured to i) provide a graphical user interface within a browser window on the client device from which the external party inputs the values of the set of application workload parameters, and ii) transmit the request from a browser window on a computer.

12. The apparatus of claim 11,
wherein the browser script is further configured to execute the application simulation program on the client device;
wherein the controlling circuitry is further constructed and arranged to:
  receive the synthetic data generated by the client device; and
  provide configuration information to the external client based on the synthetic data.

13. The apparatus of claim 12,
wherein the controlling circuitry is further constructed and arranged to:
  perform an update operation on the application model based on the synthetic data generated by the client device.

14. The apparatus of claim 10,
wherein the controlling circuitry constructed and arranged to obtain the application model is further constructed and arranged to:
  perform a lookup operation on the local database, the lookup operation being configured to locate a model stored in the Model database having values of the set of application workload parameters that match the values of the set of application workload parameters of the request to within a predefined tolerance.

15. The apparatus of claim 14,
wherein the first values of the set of application workload parameters includes a value corresponding to a first application used by the external client;
wherein the second values of the set of application workload parameters includes a value corresponding to a second application used by the external client;
wherein the controlling circuitry constructed and arranged to locate the first model is further constructed and arranged to:
  produce a model from the Model database derived from data generated from a simulation of the first application; and
wherein locating the second model includes:
  produce a model from the Model database derived from data generated from a simulation of the second application.

16. A computer program product having a non-transitory, computer-readable storage medium which stores code for providing an external client capability of simulating application workloads on storage system devices, the code including instructions which, when executed by a computer, causes the computer to:
  receive, from an external client at a remote location, a request to simulate an application workload on a storage system device resulting from an execution of an application, the request including values of a set of application workload parameters;
  obtain, with reference to a Model database, an application model based on the values of the set of application workload parameters, the application model being configured to reproduce application workload conditions on the storage system device;
  compile an application simulation program, the compilation of the application simulation program being based on the application model; and
  after compiling the application simulation program, transmit, to the external client, the application simulation program which, when executed, causes a client device to generate synthetic data that is indicative of how the storage system device performs under the application workload conditions
wherein obtaining the application model includes:
  locating a first model stored in the Model database having first values of the set of application workload parameters that match the values of the set of application workload parameters of the request to within the predefined tolerance;
  locating a second model stored in the Model database having second values of the set of application workload parameters match the values of the set of application workload parameters of the request to within the predefined tolerance; and
performing a best fit operation on the first values and the second values to produce the application model.

17. The computer program product of claim 16,
wherein the code includes further instructions which, when executed by a computer, causes the computer to:
  provide a browser script to the external client that is configured to i) provide a graphical user interface within a browser window on the client device from which the external party inputs the values of the set of application workload parameters, and ii) transmit the request from a browser window on a computer.

18. The computer program product of claim 17,
wherein the browser script is further configured to execute the application simulation program on the client device;
wherein the code includes further instructions which, when executed by a computer, causes the computer to:
  receive the synthetic data generated by the client device; and
  provide configuration information to the external client based on the synthetic data.

19. A method as in claim 1, wherein receiving the request to simulate the application workload on the storage system device includes receiving (i) an industry identifier identifying a particular vertical industry instance and (ii) an application identifier identifying a particular application that runs on the storage system device in the context of the particular vertical industry instance; and
  wherein obtaining the application model includes performing a lookup on the Model database to find application models derived from the particular application in the context of the particular vertical industry instance.

* * * * *